US011181595B2

(12) United States Patent
Mehta et al.

(10) Patent No.: US 11,181,595 B2
(45) Date of Patent: Nov. 23, 2021

(54) SYSTEM AND METHOD FOR SIMULTANEOUS MULTI-SLICE MAGNETIC RESONANCE FINGERPRINTING IMAGING USING A PARALLEL TRANSMIT RADIO FREQUENCY COIL ARRAY

(71) Applicant: Case Western Reserve University, Cleveland, OH (US)

(72) Inventors: Bhairav Bipin Mehta, Cleveland, OH (US); Simone Coppo, Cleveland, OH (US); Michael Twieg, Cleveland, OH (US); Mark A. Griswold, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 41 days.

(21) Appl. No.: 16/603,312

(22) PCT Filed: Apr. 6, 2018

(86) PCT No.: PCT/US2018/026549
§ 371 (c)(1),
(2) Date: Oct. 7, 2019

(87) PCT Pub. No.: WO2018/187739
PCT Pub. Date: Oct. 11, 2018

(65) Prior Publication Data
US 2021/0123997 A1    Apr. 29, 2021

Related U.S. Application Data

(60) Provisional application No. 62/482,752, filed on Apr. 7, 2017.

(51) Int. Cl.
*G01R 33/483*    (2006.01)
*G01R 33/56*    (2006.01)
*G01R 33/561*    (2006.01)

(52) U.S. Cl.
CPC ..... *G01R 33/4835* (2013.01); *G01R 33/5608* (2013.01); *G01R 33/5612* (2013.01)

(58) Field of Classification Search
USPC ........................................................ 324/309
See application file for complete search history.

(56) References Cited

U.S. PATENT DOCUMENTS 8,723,518 B2   5/2014  Seiberlich
10,598,747 B2 *  3/2020  Gulani ................. G01R 33/561
(Continued)

FOREIGN PATENT DOCUMENTS

| CN | 104704352 A | 6/2015 |
| CN | 106537168 A | 3/2017 |
| WO | 2015073894 A2 | 5/2015 |

OTHER PUBLICATIONS

Cloos, M. et al. "Online Radial Multiband Magnetic Resonance Fingerprinting." Proceedings of the International Society for Magnetic Resonance in Medicine, 24th Annual Meeting and Exhibition, Singapore, May 7-13, 2016. vol. 24, 608, Apr. 22, 2016.
(Continued)

*Primary Examiner* — Rodney E Fuller
(74) *Attorney, Agent, or Firm* — Quarles & Brady LLP

(57) ABSTRACT

Systems and methods are provided for acquiring imaging data from one or more resonance species that simultaneously produce individual magnetic resonance signals in a plurality of different slices. The data is acquired by simultaneously exciting, using a pTX RF coil array, a plurality of different slices such that at least some of the plurality of different slices are excited by transmitting RF energy from a subset of transmit channels in the pTX RF coil array. The method also includes comparing the data to a dictionary of signal evolutions to determine quantitative values for two or more parameters of the resonant species based, at least in part, on matching the data to a set of known signal evolutions stored (Continued)

in the dictionary. The method includes producing an image for each of the plurality of different slice locations, at least in part, on the quantitative values.

18 Claims, 4 Drawing Sheets

(56) References Cited

U.S. PATENT DOCUMENTS

| | | | |
|---|---|---|---|
| 2014/0103924 A1 | 4/2014 | Griswold |
| 2015/0301141 A1 | 10/2015 | Griswold |
| 2015/0346300 A1 | 12/2015 | Setsompop et al. |
| 2016/0282436 A1 | 9/2016 | Cloos |
| 2017/0007148 A1 | 1/2017 | Kaditz |
| 2017/0010340 A1 | 1/2017 | Eichner et al. |

OTHER PUBLICATIONS

European Patent Office. Extended European Search Report for application 18780918.9. dated Nov. 30, 2020. 8 pages.

Buonincontri, G. et al. "MR fingerprinting with simultaneous B1 estimation" Magnetic resonance in medicine 76.4 (2016): 1127-1135.

Cloos, M. et al. "Multiparametric imaging with heterogeneous radiofrequency fields" Nature communications 7 (2016): 12445.

International Searching Authority, International Search Report and Written Opinion for application PCT/US2018/026549, dated Jun. 29, 2018.

Jiang, Y. et al. "Use of pattern recognition for unaliasing simultaneously acquired slices in Simultaneous MultiSlice Magnetic Resonance Fingerprinting". Proceedings of ISMRM (2015).

Krupa, K. et al. "Artifacts in magnetic resonance imaging." Polish journal of radiology 80 (2015): 93.

Ma, D. et al., in "Magnetic Resonance Fingerprinting," Nature, 2013; 495(7440):187-192.

Van De Moortele, P. et al. "B1 destructive interferences and spatial phase patterns at 7 T with a head transceiver array coil." Magnetic resonance in medicine 54.6 (2005): 1503-1518.

China National Intellectual Property Administration. First Office Action for application 201880036311. dated Jun. 18, 2021. With translation. 21 pages.

* cited by examiner

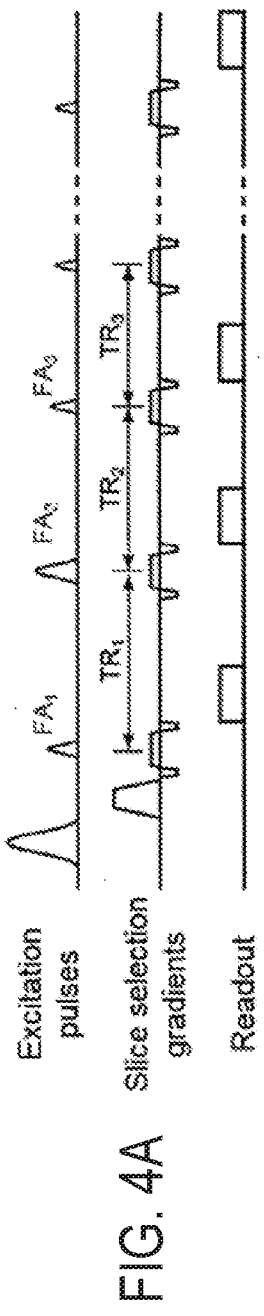
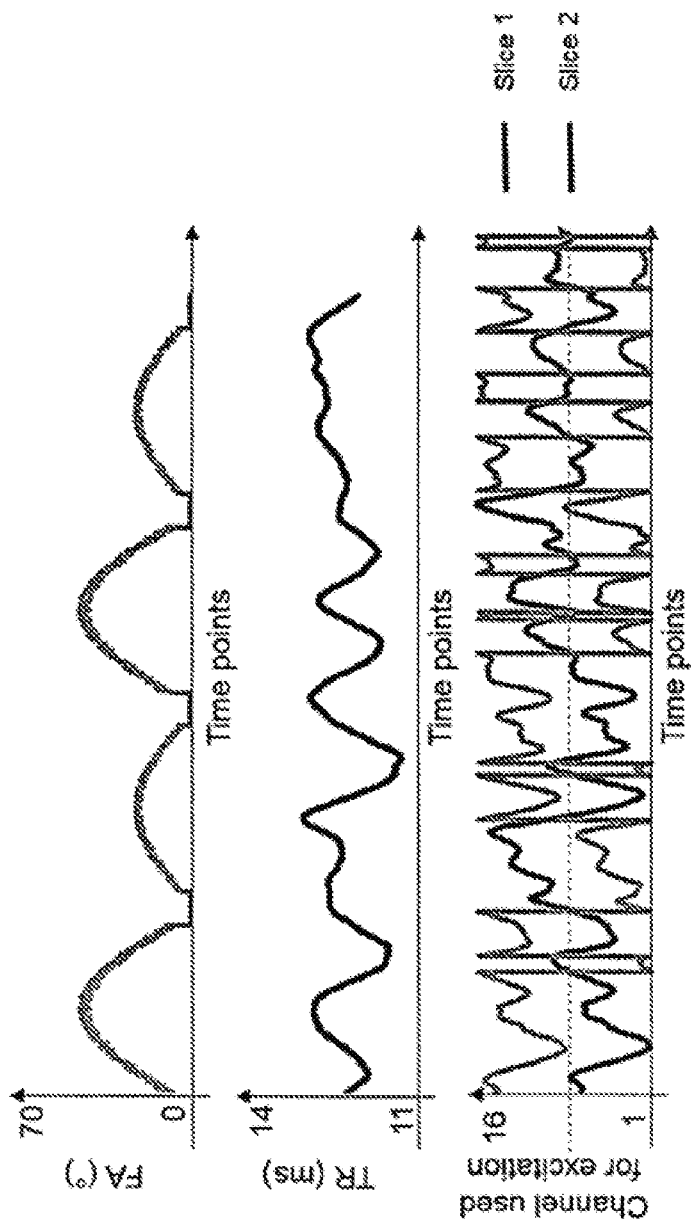
FIG. 4A
FIG. 4B

SYSTEM AND METHOD FOR SIMULTANEOUS MULTI-SLICE MAGNETIC RESONANCE FINGERPRINTING IMAGING USING A PARALLEL TRANSMIT RADIO FREQUENCY COIL ARRAY

CROSS-REFERENCE TO RELATED APPLICATIONS

This application represents the U.S. National Stage Entry of International Application PCT/US2018/026549, filed Apr. 6, 2018, which claims the benefit of, and claims priority to U.S. Provisional Application 62/482,752, filed Apr. 7, 2017. Each of the preceding applications is hereby incorporated herein by reference in its entirety for all purposes.

STATEMENT REGARDING FEDERALLY SPONSORED RESEARCH

This invention was made with government support under EB016728 and EB017219 awarded by the National Institutes of Health. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," *Nature*, 2013; 495(7440):187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

SUMMARY OF THE DISCLOSURE

The present disclosure provides systems and methods for performing simultaneous multi-slice (SMS) techniques to perform MRF imaging using a parallel transmit (pTX) array. More particularly, system and methods are provided to use the MRF framework to perform SMS by temporarily varying the transmit channels exciting various slices to capture an entire field of view of multiple slices using an MRF pulse sequence.

In accordance with one aspect of the disclosure, a method is provided that includes a) acquiring data with a magnetic resonance imaging (MRI) system in a series of variable sequence blocks that cause one or more resonance species in a subject to simultaneously produce individual magnetic resonance signals in a plurality of different slices. The series of variable sequence blocks includes simultaneously exciting, using the pTX RF coil array, the plurality of different slices such that at least some of the plurality of different slices are excited by transmitting RF energy from a subset of transmit channels in the pTX RF coil array. The method also includes comparing the acquired data to a dictionary of signal evolutions to determine quantitative values for two or more parameters of the resonant species based, at least in part, on matching the separated magnetic resonance data to a set of known signal evolutions stored in the dictionary. The method further includes producing an image for each of the plurality of different slice locations depicting the subject at that slice location based, at least in part, on the quantitative values.

In accordance with another aspect of the present disclosure, a system is provided that includes a magnet system, a plurality of gradient coils, a radio frequency (RF) system, and a computer system. The magnet system can be configured to generate a polarizing magnetic field about at least a region of interest of a subject arrange in the system. The plurality of gradient coils can be configured to apply a gradient field to the polarizing magnetic field. The RF system can include a pTX RF coil array. The RF system can be configured to apply excitation fields to the subject and acquire MR image data from the ROI. The computer system can include a processor and a memory. The memory can have stored thereon instructions that, when executed by the processor, cause the processor to perform the methods described herein.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

FIG. 4A is an example pulse sequence than can be used in accordance with some embodiments of the methods described in the present disclosure;

FIG. 4B shows an example pattern of varying sequence parameters, including temporally varying a subset of transmit channels used to excite different ones of a plurality of slices, in accordance with some embodiments of the present disclosure.

DETAILED DESCRIPTION

Figure 1:
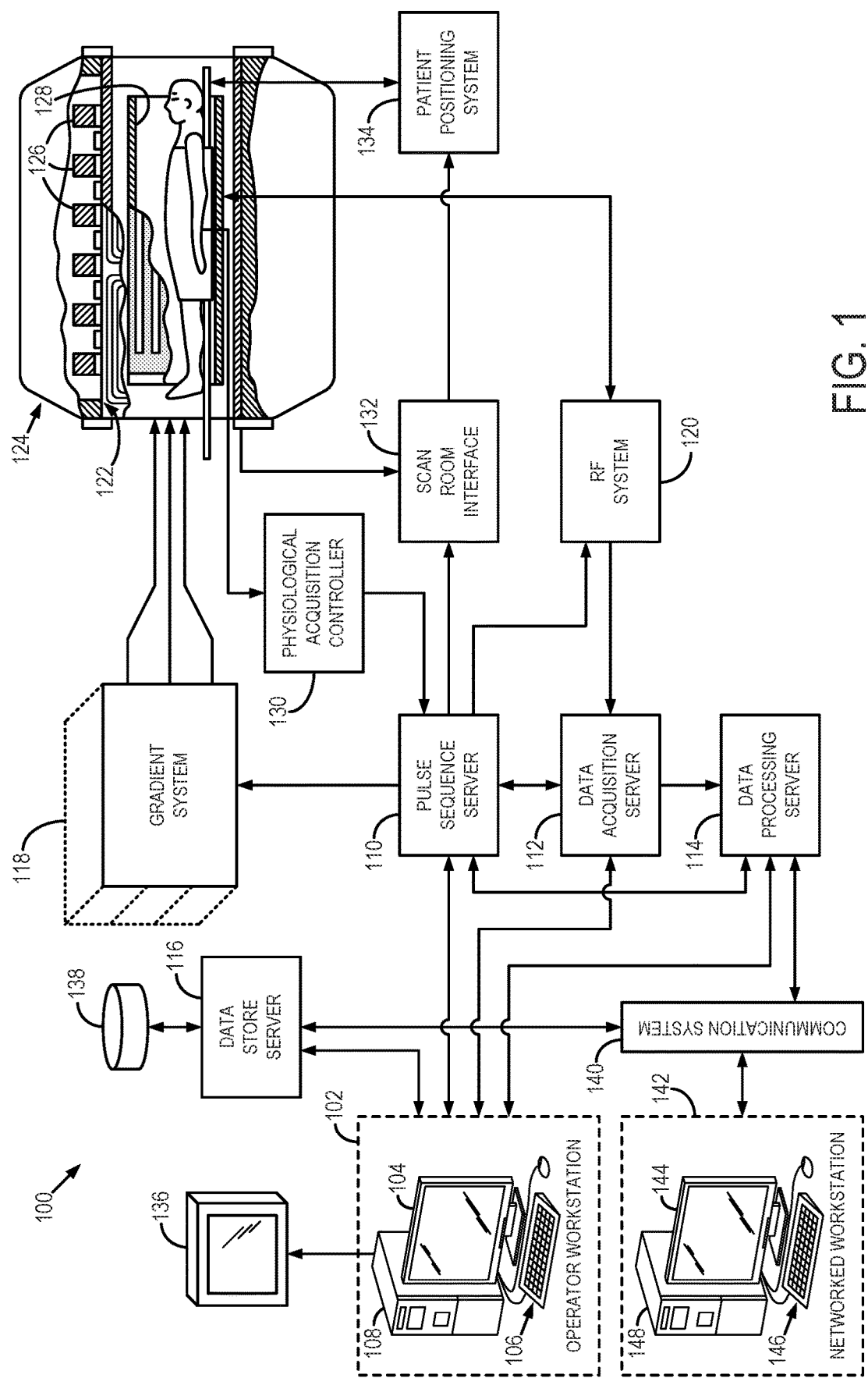
FIG. 1 is a block diagram of an example magnetic resonance imaging ("MRI") system that can implement the methods described in the present disclosure.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i(T_1, T_2, D)$ is provided as an example, in different situations, the decay term, $E_i(T_1, T_2, D)$, may also include additional terms, $E_i(T_1, T_2, D, K)$ or may include fewer terms, such as by not including the diffusion relaxation, as $E_i(T_1, T_2)$ or $E_i(T_1, T_2, K)$. Also, the summation on "j" could be replace by a product on "j".

The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

As will be described, the present disclosure provides an MRF framework for simultaneous multi-slice (SMS) MRF imaging using a parallel transmit (pTX) RF coil array. That is, system and methods are provided to use the MRF framework to perform SMS by temporally varying the transmit channels exciting various slices to capture an entire field of view of multiple slices using an MRF pulse sequence.

Referring particularly now to FIG. 1, an example of an MRI system 100 that can implement the methods described here is illustrated. The MRI system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \qquad (3);$$

and the phase of the received magnetic resonance signal may also be determined according to the following relationship:

$$\varphi = \tan^{-1}\left(\frac{Q}{I}\right). \qquad (4)$$

The RF system 120 can also include one or more RF transmit channels that produce a prescribed RF excitation field. The base, or carrier, frequency of this RF excitation field is produced under control of a frequency synthesizer that receives a set of signals (e.g., digital signals) from the pulse sequence server 110. These signals indicate the frequency and phase of the RF carrier signal. The RF carrier is applied to a modulator and up converter where its amplitude is modulated in response to a signal, R(t), also received from the pulse sequence server 110. The signal, R(t), defines the envelope of the RF excitation pulse to be produced. The magnitude of the RF excitation pulse is attenuated, for example, by an exciter attenuator circuit that receives a digital command from the pulse sequence server 110. The attenuated RF excitation pulses are then applied to a power amplifier that drives a pTX RF coil array.

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

Figure 2:
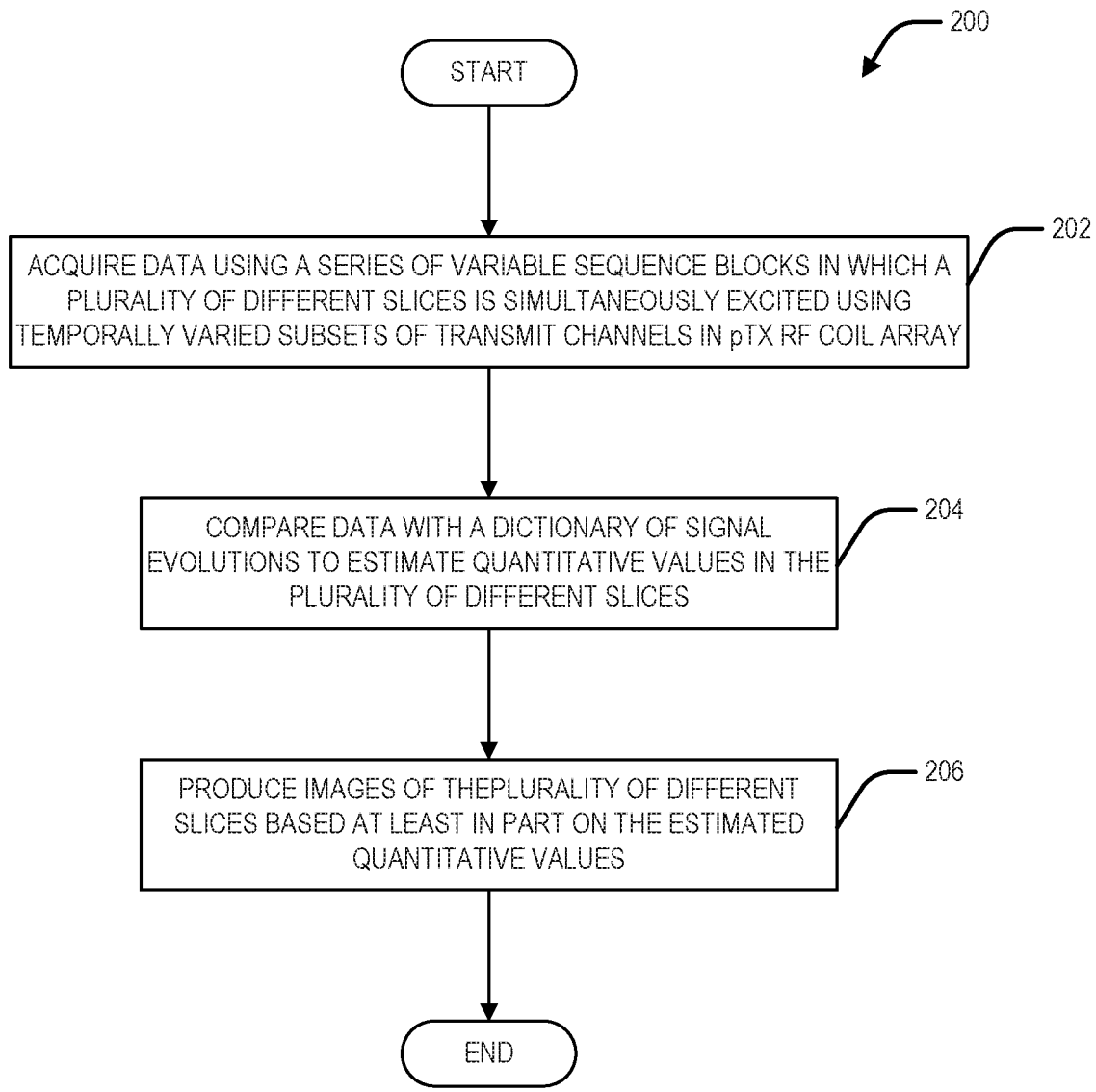
FIG. 2 is a flowchart illustrating a method in accordance with the present disclosure.

Referring to FIG. 2, the present disclosure provides a method 200 of SMS MRF using a pTX RF coil array. At process block 202, the method 200 can include acquiring data from a subject using a series of variable sequence blocks, in which a plurality of different slices are simultaneously excited using a pTX RF coil array. As described above, a series of variable sequence blocks can be implemented to this end. In the series of variable sequence blocks, a subset of the transmit channels available for the pTX RF coil array are used to excite a given slice, and this subset can be temporally varied across the variable sequence blocks. In general, for a pTX RF coil array having N coils, the subset used to excite a given slice will include M<N coils. As a non-limiting example, when simultaneously exciting two slices using a pTX RF coil array with four transmit channels, two of the channels can be used to excite the first slice while the other two channels can be used to excite the second slice. For instance, a first RF excitation pulse can be generated using the first subset of coils to excite spins in the first slice, whereas a second RF excitation pulse can be generated using the second subset of coils to simultaneously excite spins in the second slice.

In some implementations, a multiband RF pulse can be generated using a subset of coils, such that multiple slices are simultaneously excited by that subset of coils. For instance, a first multiband RF excitation pulse can be generated using the first subset of coils to simultaneously excites spins in a first group of slices, whereas a second RF pulse, which may be a single band or multiband RF pulse, can be generated using the second subset of coils, such that one or more slices are simultaneously excited with the first group of slices.

In general, for a pTX RF coil array having N coils being used to simultaneously excite K slices, each subset of RF coils can include N/K coils, such that each coil in the pTX RF coil array is uniquely assigned to one of the subsets for each excitation. In other implementations, a different number of RF coils can be included in each subset of RF coils. The number of coils may or may not be the same in each subset used for a particular excitation.

The particular channels that are used in each excitation can then be temporally varied amongst the available channels, such that the entire field-of-view is excited for each slice by performing the series of variable sequence blocks. For instance, in the example mentioned above where a pTX RF coil array with N=4 coils is used to simultaneously excite two different slices, a first subset group could include using coils #1 and #2 to excite slice #1, and coils #3 and #4 to excite slice #2. Then, in a subsequent variable sequence block the subset groups could be changed such that coils #3 and #4 are used to excite slice #1, and coils #1 and #2 are used to excite slice #2. In some implementations, the coils in the subset can be further permutated, such as by using coils #1 and #3 to excite slice #1, and coils #2 and #4 to excite slice #2. In this latter example, the same coil may be used in different subsets to excite the same slice in different variable sequence blocks. In other examples, however, the subsets may be designed such that each coil is only used once to excite a particular slice. It will be appreciated that any such number of variable combinations of coils used in a subset.

In still other examples, the number of coils in the subsets can also be temporally varied. For instance, where a pTX coil array with N=8 coils is used, in some variable sequence blocks each subset of coils may include 2 coils, whereas in subsequent variable sequence blocks each subset of coils may include more than 2 coils. Similarly, in some implementations the number of slices that are simultaneously excited may be temporally varied. As an example, a first series of variable sequence blocks may include simultaneously exciting two slices at a time, with four different coils being used in each subset of coils. Then, in a later series of variable sequence blocks, four different slices may be simultaneously excited, with two different coils being used in each subset of coils. It will be appreciated that other such combinations of the number of coils used in a subset, the number of slices being simultaneously excited, or both, can be varied.

At process block 206, the method 200 can include comparing the data acquired in process block 202 with a dictionary of signal evolutions. At process block 206, the method 200 can include producing images of the plurality of different slices based at least in part on the quantitative values estimated by comparing the acquired data with the dictionary.

In one specific, but non-limiting, example application, a 16 channel pTX array can be used to perform SMS MRF imaging. In this approach, separate transmit channels are used to excite different slices. Since each transmit channel has a different B1+ profile, the transmit channel can be driven in a fashion such that the merged image of the multiple slices presents minimal aliasing.

Figure 3:
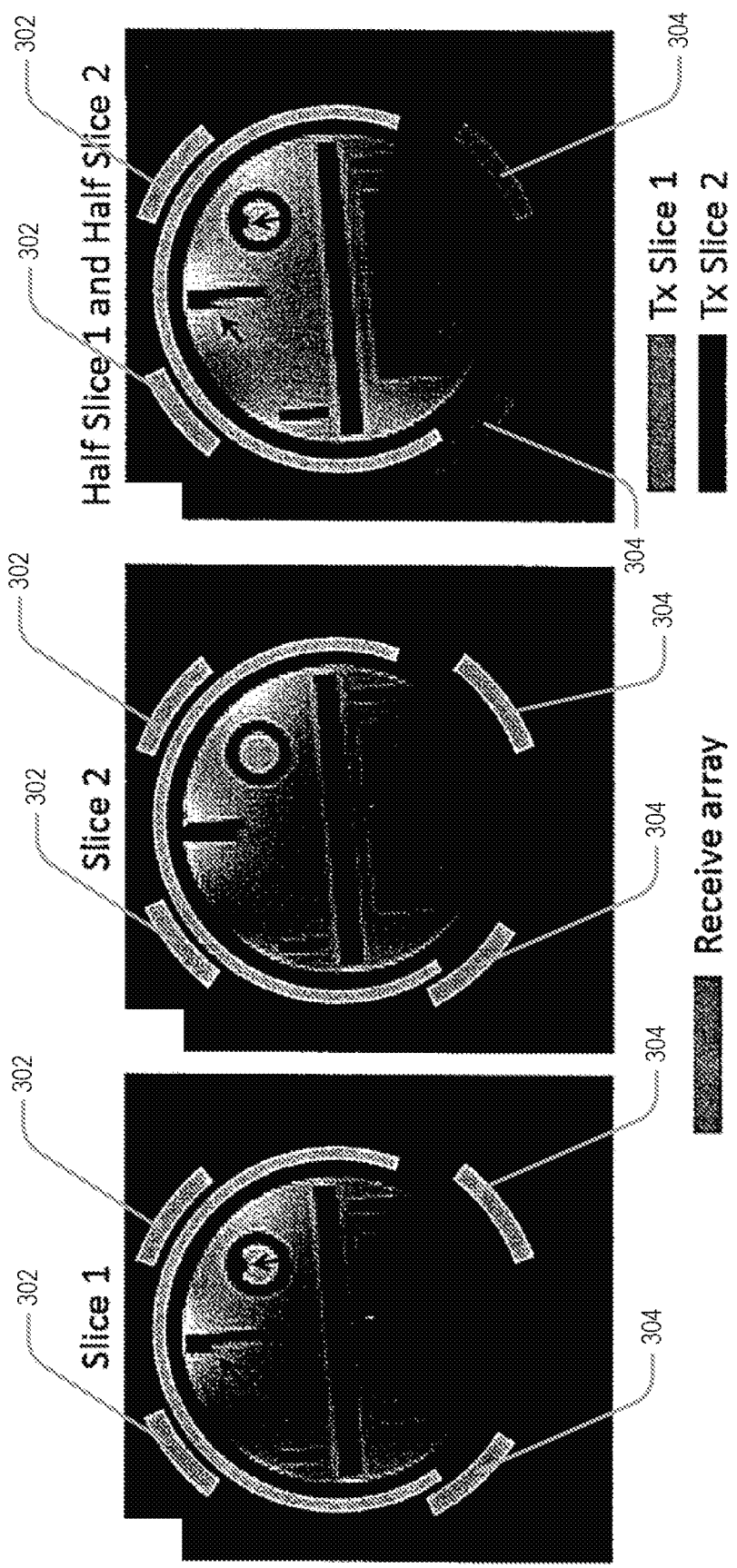
FIG. 3 is an illustration of the use of a pTX array for exciting different regions of multiple slices to avoid aliasing.

Referring to FIG. 3, an illustration of the use of a pTX array for exciting different regions of multiple slices to avoid aliasing is shown. FIG. 3 shows one example, where 4 transmit channels (two top channels 302 and two bottom channels 304) were used to acquire gradient echo (GRE) images. The image for Slice 1 in FIG. 3 shows a GRE image where all four channels 302, 304 were used to excite slice 1. The image for Slice 2 in FIG. 3 shows a GRE image where all four channels 302, 304 were used to excited slice 2. The image for half Slice 1 and half Slice 2 in FIG. 3 shows a GRE image where the top two channels 302 were used to excite slice 1 and the bottom two channels 302 were used to excite slice 2. The image for half Slice 1 and half Slice 2 of FIG. 3, thus, shows that the top half is from slice 1 and the bottom half is from slice 2.

The characteristics shown in FIG. 3 can be utilized in the MRF framework to perform SMS. The approach involves temporally varying the transmit channels exciting slice 1 and slice 2 to ensure capture of the entire field of view for all slices. In some cases, the selection of the channels for a given time frame can be done in a similar fashion as shown in the image for half Slice 1 and half Slice 2 of FIG. 3, such that each frame presents minimal aliasing of multiple slices.

Referring to FIG. 4A, an example pulse sequence that can be implemented in one or more variable sequence blocks is shown. FIG. 4B shows a pattern for varying sequence parameters across an example series of variable sequence blocks. As shown, the transmit channels used to excite different slices in each sequence block is temporally varied.

For reconstruction, an MRF template matching can be performed based on pattern recognition. The dictionary can be generated using any suitable technique for MRF. In one example approach, separate dictionaries for each spatial location can be generated using B1+ measured in a separate scan. In another example approach, B1+ terms for different channels can be included as additional dimensions within the dictionary.

The present disclosure has described one or more preferred embodiments, and it should be appreciated that many equivalents, alternatives, variations, and modifications, aside from those expressly stated, are possible and within the scope of the invention.

The invention claimed is:

1. A method of simultaneous multi-slice (SMS) magnetic resonance fingerprinting (MRF) imaging using a parallel transmit (pTX) radio frequency (RF) coil array, the method comprising:
   a) acquiring data with a magnetic resonance imaging (MRI) system in a series of variable sequence blocks that cause one or more resonance species in a subject to simultaneously produce individual magnetic resonance signals in a plurality of different slices, wherein the series of variable sequence blocks includes simultaneously exciting, using the pTX RF coil array, the plurality of different slices such that at least some of the plurality of different slices are excited by transmitting RF energy from a subset of transmit channels in the pTX RF coil array;
   b) comparing the acquired data to a dictionary of signal evolutions to determine quantitative values for two or more parameters of the resonant species based, at least in part, on matching the acquired data to a set of known signal evolutions stored in the dictionary; and
   c) displaying an image for each of the plurality of different slice locations depicting the subject at that slice location based, at least in part, on the quantitative values.

2. The method of claim 1, wherein step b) includes comparing the acquired data as individual slices of the plurality of different slices to the dictionary to determine quantitative values for two or more parameters of the resonant species in each individual slice.

3. The method of claim 2, wherein the dictionary includes at least a first dictionary and a second dictionary and comparing the acquired data as individual slices of the plurality of different slices to the dictionary includes comparing the acquired data as individual slices of the plurality of different slices to each of the first dictionary and the second dictionary.

4. The method of claim 1, wherein the series of variable sequence blocks includes temporally varying the subset of transmit channels in the pTX RF coil array.

5. The method of claim 4, wherein the subset of transmit channels in the pTX RF coil array is temporally varied in the series of variable sequence blocks such that an entire field-of-view is excited for each of the plurality of different slices by the series of variable sequence blocks.

6. The method of claim 4, wherein the series of variable sequence blocks includes temporally varying the subset of transmit channels in the pTX RF coil array such that aliasing in the through-plane direction is minimized.

7. The method of claim 1, wherein the comparing of step b) includes template matching based pattern recognition.

8. The method of claim 1, wherein the dictionary includes separate sub-dictionaries for each spatial location, wherein the sub-dictionaries are generated using spatial distributions of RF energy measured in a separate scan.

9. The method of claim 1, wherein the dictionary is generated by including B1+ terms for different channels as additional dimensions within the dictionary.

10. A system for simultaneous multi-slice (SMS) magnetic resonance fingerprinting (MRF) imaging using parallel transmit array (pTX), the system comprising:
   a magnet system configured to generate a polarizing magnetic field about at least a region of interest of a subject arrange in the system;
   a plurality of gradient coils configured to apply a gradient field to the polarizing magnetic field;
   a radio frequency (RF) system comprising a multichannel transmit RF coil array forming the pTX RF coil array, the RF system configured to apply excitation fields to the subject and acquire MR image data from a region-of-interest (ROI) therein; and
   a computer system comprising a processor and a memory, the memory having stored thereon instructions that, when executed by the processor, cause the processor to control the plurality of gradient coils and the RF system to perform the SMS MRF imaging process by:
      acquire data in the series of variable sequence blocks that cause one or more resonance species in a subject to simultaneously produce individual magnetic resonance signals in a plurality of different slices, wherein the series of variable sequence blocks includes simultaneously exciting, using the pTX RF coil array, the plurality of different slices such that at least some of the plurality of different slices are excited by transmitting RF energy from a subset of transmit channels in the pTX RF coil array;
      compare the acquired data to a dictionary of signal evolutions to determine quantitative values for two or more parameters of the resonant species based, at least in part, on the acquired data to a set of known signal evolutions stored in the dictionary; and
      display an image for each of the plurality of different slice locations depicting the subject at that slice location based, at least in part, on the quantitative values.

11. The system of claim 10, wherein, to compare the acquired data, the computer system is further caused to compare the acquired data as individual slices of the plurality of different slices to the dictionary to determine quantitative values for two or more parameters of the resonant species in each individual slice.

12. The system of claim 11, wherein the dictionary includes at least a first dictionary and a second dictionary and, to compare the acquired data as individual slices of the plurality of different slices to the dictionary, the computer system is further caused to compare the acquired data as individual slices of the plurality of different slices to each of the first dictionary and the second dictionary.

13. The system of claim 10, wherein to acquire the data using the series of variable sequence blocks, the computer system is further caused to temporally vary the subset of transmit channels in the pTX RF coil array.

14. The system of claim 13, wherein the computer system is further caused to temporally vary the subset of transmit channels in the pTX RF coil array such that an entire field-of-view is excited for each of the plurality of different slices by the series of variable sequence blocks.

15. The system of claim 13, wherein the computer system is further caused to temporally vary the subset of transmit channels in the pTX RF coil array such that aliasing in the through-plane direction is controlled.

16. The system of claim 10, wherein the computer system is further caused to perform template matching based pattern recognition to compare the acquired data to the dictionary.

17. The system of claim 10, wherein the dictionary includes separate sub-dictionaries for each spatial location, wherein the sub-dictionaries are generated using spatial distributions of RF energy measured in a separate scan.

18. The system of claim 10, wherein the dictionary includes B1+ terms for different channels as additional dimensions within the dictionary.

* * * * *